(12) United States Patent
Capasso et al.

(10) Patent No.: US 6,556,604 B1
(45) Date of Patent: Apr. 29, 2003

(54) FLAT MINIBANDS WITH SPATIALLY SYMMETRIC WAVEFUNCTIONS IN INTERSUBBAND SUPERLATTICE LIGHT EMITTERS

(75) Inventors: Federico Capasso, Westfield, NJ (US); Alfred Yi Cho, Summit, NJ (US); Sung-Nee George Chu, Murray Hill, NJ (US); Claire F. Gmachl, New Providence, NJ (US); Albert Lee Hutchinson, Columbus, GA (US); Arthur Mike Sergent, New Providence, NJ (US); Deborah Lee Sivco, Warren, NJ (US); Alessandro Tredicucci, Chiavari (IT); Michael Clement Wanke, Albuquerque, NM (US)

(73) Assignee: Lucent Technologies Inc., Murray Hill, NJ (US)

( * ) Notice: Subject to any disclaimer, the term of this patent is extended or adjusted under 35 U.S.C. 154(b) by 96 days.

(21) Appl. No.: 09/708,223

(22) Filed: Nov. 8, 2000

(51) Int. Cl.$^7$ .............................. H01S 5/00; H01L 29/06
(52) U.S. Cl. .............................. 372/45; 372/46; 257/14; 257/15
(58) Field of Search .............................. 372/44, 45, 46; 257/14, 15

(56) References Cited

U.S. PATENT DOCUMENTS 6,055,254 A   4/2000   Capasso et al. ............... 372/45

FOREIGN PATENT DOCUMENTS

FR   2740271   4/1997   ............. H01S/3/18

OTHER PUBLICATIONS

L. R. Wilson et al., *Controlling the performance* . . . , Appl. Phys. Lett., vol. 76, No. 7, pp. 801–803 (Feb. 2000).
A. Tredicucci et al., *Continuous wave* . . . , Electron. Lett., vol. 36, No. 10, pp. 876–878 (May 2000).
G. Strasser et al., *GaAs/AlGaAs superlattice* . . . , Appl. Phys. Lett., vol. 75, No. 10, pp. 1345–1347 (Sep. 1999).
F. Capasso et al., *High–Performance* . . . , IEEE J. Selected Topics in Quantum Electronics, vol. 5, No. 3, pp. 792–807 (May/Jun. 1999).
G. Scamarcio et al., *High–Power Infrared* . . . , Science, vol. 276, pp. 773–776 (May 1997).
Tredicucci et al., *High–power inter–miniband* . . . , Appl. Phys. Lett., vol. 72, No. 19, pp. 2388–2390 (May 1998).

Primary Examiner—Quyen Leung
(74) Attorney, Agent, or Firm—Michael J. Urbano, Esq.

(57) ABSTRACT

The RT regions of an ISB light emitter comprise pre-biased SLs and a multiplicity of split quantum wells (SPQWs). A SPQW is a quantum well that is divided into a multiplicity of sub-wells by a first barrier layer sufficiently thin that the upper and lower energy states are split beyond their natural broadening and contribute to different minibands in each RT region. In contrast, adjacent SPQWs are coupled to one another by second barrier layers. The thicknesses of the latter layers are chosen so that minibands are created across each RT region. In one embodiment, the emitter includes an I/R region between adjacent RT regions, and in another embodiment the I/R regions are omitted.

16 Claims, 6 Drawing Sheets

FLAT MINIBANDS WITH SPATIALLY SYMMETRIC WAVEFUNCTIONS IN INTERSUBBAND SUPERLATTICE LIGHT EMITTERS

GOVERNMENT CONTRACTS

This invention was made with Government support under Contract No. DAAD19-00-C-0096 awarded by the DARPA/US Army Research Office. The Government has certain rights in this invention.

FIELD OF THE INVENTION

This invention relates generally to intersubband (ISB) superlattice (SL) light emitters and, more particularly, to quantum cascade (QC) SL lasers that have essentially flat minibands and spatially symmetric wavefunctions.

BACKGROUND OF THE INVENTION

In an ISB SL laser the optical transition takes place between an upper miniband (i.e., energy states near or at the bottom of that band) and a lower miniband (i.e., energy states near or at the top of that band). In order for these lasers to properly function a flatband condition of the upper and lower minibands must exist; i.e., two conditions should be met: (1) macroscopic alignment of each radiative transition (RT) region with adjacent injection/relaxation (I/R) regions, and, more importantly, (2) microscopic alignment of the upper laser energy levels within each RT (and similar alignment of the lower laser levels). However, in the presence of an applied field (e.g., the external bias applied transverse to the layers to induce lasing) the quantum states, from quantum well (QW) layer to QW layer, shift to higher and higher energies in the direction of the field if an SL of essentially identical QW regions is used. This problem is addressed in U.S. Pat. No. 6,055,254 granted to F. Capasso et al. on Apr. 25, 2000 (hereinafter the Capasso 55 patent), which is assigned to the assignee hereof and which is incorporated herein by reference. The Capasso 55 patent describes an ISB SL laser in which the internal electronic potential is pre-biased by varying the SL period so as to achieve an essentially flat profile, on average, of the upper and lower minibands despite the presence of an applied electric field in the SLs. FIG. 2 of Capasso 55 (nearly identical to FIG. 2 herein) illustrates the essentially flatband condition in the presence of an applied field; i.e., energy states (as represented by their wavefunctions) near or at the bottom of miniband 2 in each RT region (e.g., RT 14.5) are fully spread across the RT region, as are the energy states at or near the top of miniband 1. In each of the upper minibands 2 the wavefunction is essentially spatially symmetric with respect to a vertical plane through the midpoint (hereinafter the midplane) of the unipolar radiative transition (RT) region. In contrast, in each of the lower minibands 1 the wavefunction is significantly spatially asymmetric (illustratively having larger magnitude lobes to the right side of the midplane). The asymmetry increases as the width of the miniband decreases. One effect of this asymmetry is a lower optical dipole matrix element and hence a less efficient emitter.

In principle, the Capasso 55 design does permit the two wavefunctions at the edges of the minigap (i.e., the two energy levels or states involved in the optical transition) to be symmetric, but only in relatively narrow ranges of wavelength and electric field. However, making the wavefunctions of those two states symmetric leaves no additional degrees of freedom needed to optimize and/or control many other design issues. For example, the following parameters would be fixed: the shape of the wavefunctions and the energy position of the rest of the states in the two minibands, which may affect, among other things, injection and extraction of electrons from the minibands or optical absorption within a miniband.

Thus, a need remains in the art of ISB SL emitters for a design that provides not only essentially flat minibands but also provides essentially spatially symmetric wavefunctions (for at least the two wavefunctions involved in the optical transition) with independent control of the applied electric field, the desired wavelength of operation, the shape of the wavefunctions, and the energy position of the rest of the states in the minibands. By independent control we mean the ability to choose the value of one parameter within a set of parameters independent of the values of other parameters in the same set. Sometimes we refer to such a choice herein as being arbitrary.

In some applications, there is also a need to achieve these features in an ISB SL emitter in which essentially all of the wavefunctions in the upper and lower minibands are essentially spatially symmetric.

SUMMARY OF THE INVENTION

In accordance with one aspect of our invention, the RT regions of an ISB light emitter comprise pre-biased SLs and a multiplicity of split quantum wells (SPQWs). By a SPQW we mean a quantum well that is divided into a multiplicity of sub-wells by at least one barrier layer sufficiently thin that the upper and lower energy states are separated beyond their natural broadening and contribute to different minibands in each RT region. In contrast, adjacent SPQWs are coupled to one another by other barrier layers having thicknesses such that minibands are created across each RT region.

In one embodiment, our invention includes an I/R region between adjacent RT regions, and in another embodiment the I/R regions are omitted (i.e., an injectorless ISB emitter).

Our invention allows at least the two wavefunctions involved in the optical transition (and in one embodiment, essentially all of the wavefunctions in the minibands) to be spatially symmetric and provides an additional degree of freedom that is important for optimizing the energy position of the minibands and hence the injection and extraction of electrons. Combining the freedom to position the energy of the minibands with the ability to arbitrarily choose the electric field enables the injectorless ISB emitter design.

BRIEF DESCRIPTION OF THE DRAWING

Our invention, together with its various features and advantages, can be readily understood from the following more detailed description taken in conjunction with the accompanying drawing, in which.

In the interest of clarity and simplicity, FIGS. 1–7 and 9 have not been drawn to scale. In addition, when describing physical or optical dimensions, the symbol Å stands for Angstroms, whereas when describing electric current, it stands for Amperes.

DETAILED DESCRIPTION OF THE INVENTION

In the description that follows we will discuss in order: the basic design of an ISB light emitter, a pre-biased SL design of the RT regions, a SPQW design of the RT regions, and lasers in accordance with our invention that incorporate both of these design features in a way that provides both essentially flat minibands and essentially spatially symmetric wavefunctions. ISB lasers with and without I/R regions coupling the RT regions will also be described. Finally, we close with examples of both of these types of lasers.

General ISB SL Light Emitter

Figure 1:
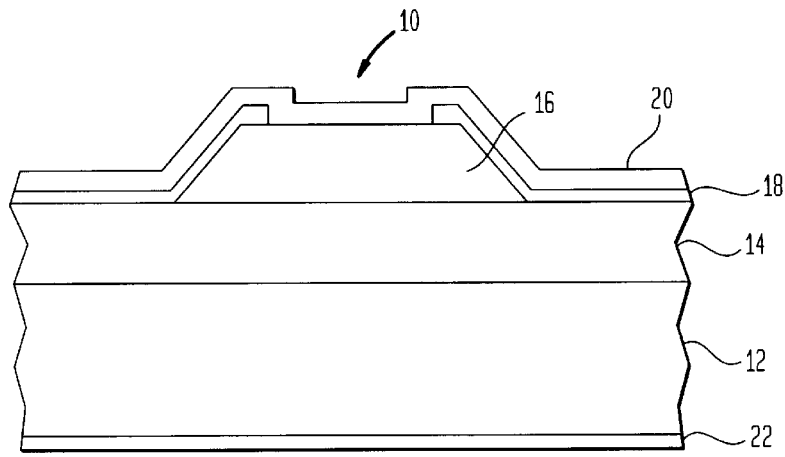
FIG. 1 is a schematic, cross-sectional view of an ISB SL light emitter in accordance with one embodiment of our invention.

With reference now to FIG. 1, an ISB SL semiconductor light emitter (e.g., a QC laser) 10 comprises a SL core region 14 sandwiched between an upper cladding region 16 and a lower cladding region 12. The core region includes the active region of the laser. The active region, in turn, includes a multiplicity of RT regions. In one embodiment, adjacent RT regions are separated by I/R regions; in another embodiment the I/R regions are omitted.

The term ISB in general refers to the well-known unipolar nature of the optical and electronic transitions that take place in the RT and I/R regions.

Typically the substrate on which the various layers of the emitter are formed serves as the lower cladding region. Alternatively, a lower cladding region, separate from the substrate, may be formed between the substrate and the core region. The upper cladding region 16 is illustratively formed in the shape of a mesa or trapezoid typical of ridge waveguide laser structures. The mesa may be shallow-etched as shown to stop at the core region 14, or it may be deep-etched so that the mesa extends into the core region.

In either case, an electrically insulating layer 18 (e.g., $Si_3N_4$ or $SiO_2$) is formed over the top of the device and is patterned to form an opening that exposes a portion of the top of the mesa. Alternatively, the insulating layer may comprise a chalcogenide glass of the type described by J. N. Baillargeon et al. in copending U.S. patent application Ser. No. 09/611,886 filed on Jul. 7, 2000, which is assigned to the assignee hereof and is incorporated herein by reference. A first electrode 20 is formed over the insulating layer 18 and in the opening so as to contact the upper cladding region (usually by means of a highly doped contact-facilitating layer, not shown), and a second electrode 22 is formed on the substrate 12.

The substrate itself may be a single crystal semiconductor body or a combination of such a body with another layer (e.g., an epitaxial layer, grown on the top surface of the body). Illustratively, lasers of this type are fabricated from Group III–V compound semiconductors; e.g., In-based Group III–V compounds such as GaInAs and AlInAs.

Drive circuitry, not shown, is coupled across the electrodes in order to provide an external voltage bias and to supply pumping energy to the laser of sufficient magnitude to generate light. Below threshold the emitter operates as an incoherent, spontaneous emission source, whereas above threshold it operates as a coherent, stimulated emission source. In the latter case, when provided with optical feedback, the source functions as laser. Suitable optical feedback is typically provided by an optical cavity resonator formed, for example, by cleaved crystal facets, distributed feedback (DFB) gratings, distributed Bragg reflectors (DBRs), or a combination of them.

Pre-biased SL

Figure 2:
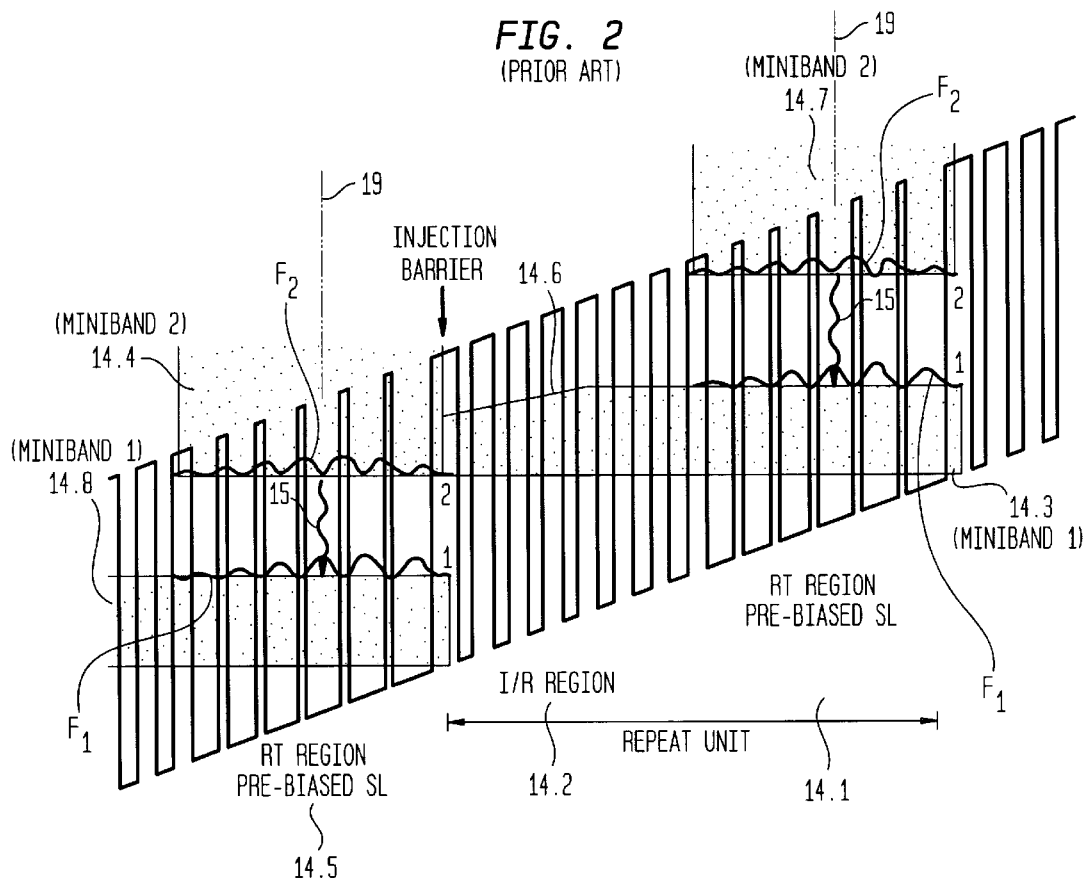
FIG. 2 is a schematic, conduction band profile of a prior art ISB light emitter in which two SL regions are bridged by an I/R region at a design electric field of 45 kV/cm.

As shown in FIG. 2, the core region 14 illustratively includes a multiplicity of N repeat units, each unit comprising a pre-biased SL RT region 14.1 and an I/R region 14.2. The effect of pre-biasing the internal electronic potential of the SLs is to produce an essentially flatband condition of upper and lower minibands despite the presence of the electric field in the SLs produced by the applied bias voltage. More specifically, from a macroscopic standpoint, the lower miniband 14.3 of one RT region 14.1 is aligned with the upper miniband 14.4 of an adjacent RT region 14.5, with the two aligned minibands being matched to and bridged by a single miniband 14.6 of the intervening I/R region 14.2. On the other hand, and as noted earlier, from a microscopic standpoint, in each of the lower minibands 1 the wavefunction is significantly spatially asymmetric (illustratively having larger magnitude lobes to the right side of the midplane). One effect of this asymmetry is a lower optical dipole matrix element and hence a less efficient emitter.

In this type of device lasing is an inter-miniband process; i.e., as shown by the wavy arrows 15, stimulated emission at a wavelength λ takes place in RT region 14.1 between the bottom-most energy level 2 (wavefunction F2) of the upper miniband 14.7 and the top-most energy level 1 (wavefunction F1) of the lower miniband 14.3. A similar process takes place in the other RT regions. For example, lasing also takes place at the same wavelength in RT region 14.5 between the bottom energy level 2 of upper miniband 14.4 and top energy level 1 of lower miniband 14.8.

The internal electronic potential of an RT region is pre-biased in the sense that an actual potential is built into the device; i.e., the energy levels of at least a first subset of the QW layers of the RT region are staggered from QW layer to QW layer. In one embodiment, pre-biasing is achieved by monotonically increasing the thicknesses of these QW layers in a first direction transverse to the layers; e.g., in the direction of the applied electric field (generated by the bias voltage). In a preferred embodiment, the thicknesses of a second subset of the barrier layers may also be varied from barrier layer to barrier layer. Preferably, the thicknesses of these barrier layers monotonically decrease or increase in the same first direction. The term subset is intended to embrace fewer than all of the QW (or barrier) layers in the RT region or all of the QW (or barrier) layers in the RT region (i.e., the complete set). Moreover, the first and second subsets need not embrace the same group of layers and need not contain the same number of layers.

Figure 3:
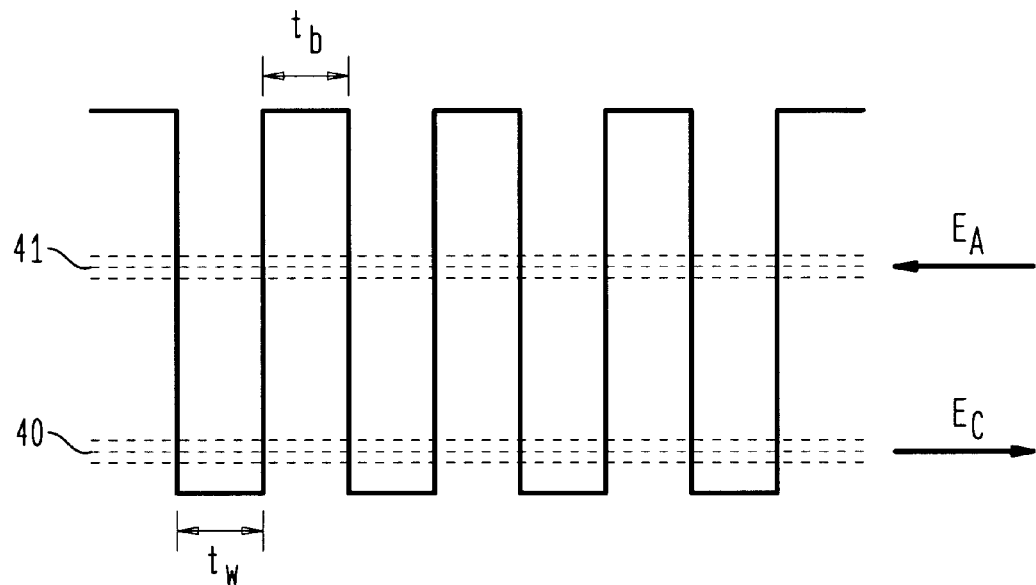
FIG. 3 is a schematic, conduction band profile showing a typical flatband condition of the minibands in the presence of an applied external electric field and a suitable internal compensating field in accordance with various prior art techniques.
Figure 4:
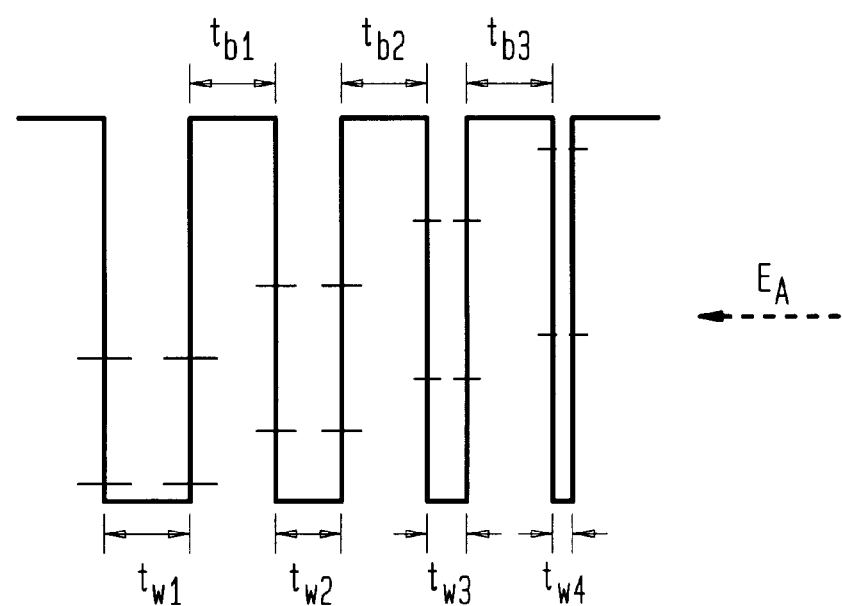
FIG. 4 is a schematic, conduction band profile of a pre-biased SL in the absence of an applied electric field in accordance with one embodiment of the Capasso 55 patent.

To better understand how the pre-biased SL RT regions provide for the desired flatband condition of the upper and lower conduction minibands, we turn to FIGS. 3 and 4. The desired flatband condition of the minibands 40 and 41 in an SL in the presence of an applied field $E_A$ is depicted in FIG. 3. Here, the SL is shown as a typical prior art, field-compensated periodic structure in which each QW layer has the same thickness $t_w$ and each barrier layer has the same thickness $t_b$. Without some form of compensating field $E_C$, however, each miniband of FIG. 3 would be split into separate quantum states at different energies in each quantum well. We take advantage of this effect by building into the SL quantum states that, in the absence of an applied field, are staggered in such a way that, in the presence of an applied field, the states are aligned with one another at the same absolute energy. Thus, as shown in FIG. 4, an SL is pre-biased by increasing the QW layer thickness $t_w$ in the direction of the electric field $E_A$ (shown in phantom since it would be applied only during the operation of the laser). Thus, for example, $t_{w4} < t_{w3} < t_{w2} < t_{w1}$, which means that the quantum states in the narrower QWs are at higher energies than the corresponding states in the wider QWs, and that the energy difference between the upper and lower levels in the narrower QWs is larger than in the wider QWs. Therefore, by grading the thicknesses of the QWs we are able to stagger the quantum states from QW to QW in such a way that the desired flatband condition of the upper and lower minibands is realized.

We note here that in relatively short SLs a desired flat miniband condition of upper and lower minibands can be achieved by varying only the QW thicknesses as previously described. In longer SLs, however, it is preferable to vary both the QW and barrier layer thicknesses; that is, in accordance with another embodiment of our invention, we preferably also vary (increase or decrease) the barrier thickness in the direction of the applied field. Whether or not the thicknesses of a particular subset of barrier layers is increased or decreased is determined empirically (including the use of computer modeling programs). Objectives of varying $t_b$ include ensuring proper coupling of the QWs, facilitating electron transport between the QWs, and providing relatively high oscillator strength (i.e., optical dipole matrix element $z_{21}$). In any case, the period defined by $(t_w + t_b)$ should not vary so widely that the SL characteristics of the RT regions are significantly impaired.

To date the best output power results have been achieved in a QC SL in which the thicknesses of a subset of the barrier layers decreased in the direction of the applied field. But, the best threshold current density results have been obtained in a QC SL laser in which the thicknesses of a subset of the barrier layers increased in the direction of the applied field.

Unfortunately, pre-biased SLs contain QW regions of various widths in which the ground state of each QW and the energy separation between it and the first excited state of the well are not independent. In particular, as the QW regions get thinner, the separation of the first two states in the QWs increases, as shown in FIG. 4. Therefore, if the ground states of the isolated QWs are all aligned in the absence of an applied electric field such that a flat miniband forms, then the first excited states cannot also be perfectly aligned and vice versa. When the energy levels of the isolated wells are not aligned at the same energy, the spatial extent and symmetry of the resulting wavefunctions of the minibands are reduced, resulting, for example in lower optical dipole matrix element for the lasing transition.

The wavefunctions (moduli squared) of the levels 1 and 2 are illustrated in FIG. 2. Note that within each RT these wavefunctions extend across all of the QWs of that RT, thus indicating that the QWs are effectively coupled to one another. However, as mentioned earlier, the wavefunctions F2 at or near the bottom of the upper minibands 14.4 and 14.7 are essentially spatially symmetric, whereas the corresponding wavefunctions F1 at or near the top of the lower minibands 14.3 and 14.8 are significantly spatially asymmetric. That is, with symmetry being measured relative to the midplanes 19 of the RT regions, it is apparent that the magnitude of the lobes of each wavefunction F1 on the right side of the midplane 19 are higher that those on the left side. Thus, each wavefunction F1 lacks mirror symmetry with respect to its corresponding midplane 19. In contrast, each wavefunction F2 has substantial mirror symmetry with respect to its midplane 19. It is typical of the pre-biased SL design that wavefunction symmetry can be achieved in either the upper miniband (as shown), or the lower miniband (not shown), but not both without compromising other important aspects of the design, as discussed earlier.

Split Quantum Wells

Figure 5:
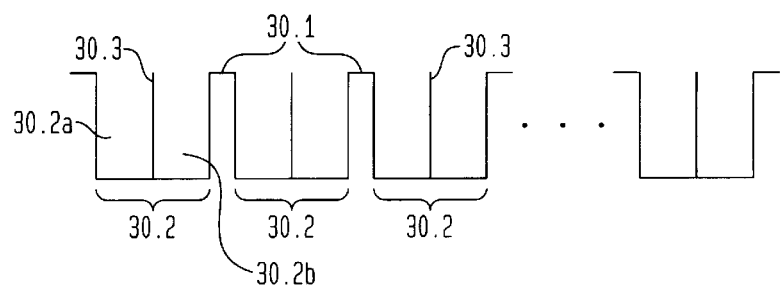
FIG. 5 is a schematic, conduction band profile of a SPQW RT region in the absence of an applied electric field in accordance with one embodiment of our invention.

Split quantum wells (SPQWs) in the conduction band of an RT region 30 are illustratively shown in FIG. 5. This configuration has relatively thick, standard barrier regions 30.1 that separate adjacent QWs 30.2 from one another. In addition, each QW has a relatively thin barrier region 30.3 that divides (i.e., splits) each quantum well 30.2 into a pair of adjacent sub-wells 30.2a and 30.2b.

Although the barriers 30.3 are depicted as dividing the QWs in half, this ratio is not essential as long as the following criteria are satisfied. Moreover, each QW could include more than one thin barrier so as to divide the QW into more than two sub-wells.

The thicknesses of the standard barrier regions 30.1 are chosen such that the minibands of the desired energy width are created across each RT region. What is desired in this regard is that the energy width of the lower minibands is less than the energy of the optical transition so as to reduce optical absorption while being large enough to reduce thermal population of the lower state of the optical transition. In contrast, the thicknesses of the barrier regions 30.3 are chosen so that (1) the energy separation between the upper and lower states exceeds their natural broadening and (2) these states contribute to different minibands in each RT region. Stated in another way, the thickness of the thin barriers 30.3 is less than the thickness at which the energy difference between minibands is approximately equal to the energy difference between states within each miniband.

The relative thicknesses of the thin barrier regions 30.3 and the standard barriers 30.1 can be stated as follows. With respect to a particular SPQW and its associated standard barrier regions, in general the standard barrier regions 30.1 are thicker than the thin barrier regions 30.3. However, when comparing a particular standard barrier region in one part of the R/T region (e.g., at one end of the R/T region) with a particular thin barrier region in a somewhat remote part of the R/T region (e.g., at or near the opposite end of the R/T region), it is possible (due to the grading of the SLs) that these two barrier regions might have comparable thicknesses or even that the standard barrier region might have a thickness less than that of the thin barrier region.

Combination of Pre-biased SL and SPQW

In accordance with one aspect of our invention, an ISB SL light emitter incorporates both a pre-biased SL and SPQW designs mutually adapted to achieve both essentially flat upper and lower minibands as well as essentially symmetric wavefunctions in each of those minibands.

By replacing each conventional QW with a SPQW in a pre-biased SL, we have discovered that we can create upper and lower essentially flat minibands and simultaneously essentially spatially symmetric (states) wavefunctions for at least the two wavefunctions involved in the optical transition, in one embodiment, and for essentially all of the wavefunctions in the minibands, in another embodiment. In an isolated SPQW, the combined thickness of the two sub-wells and the thickness of the thin barrier region separating them are two independent parameters that allow the ground state and the first excited state to be positioned independently of one another at any absolute energy. Therefore, using SPQWs in a pre-biased SL, in contrast to the use of standard QWs in pre-biased SL in the prior art, we can compensate an applied electric field and align the ground states of the individual SPQWs while simultaneously aligning the first excited states. This combination results in essentially flat upper and lower minibands with essentially spatially symmetric wavefunctions at the design electric field for at least the two states involved in the optical transition. The miniband width is controlled by a third independent parameter, the set of thicknesses of the standard barrier regions separating adjacent SPQWs. Therefore, in this embodiment of our invention, the energy position of the bottom miniband, its width, the width of the minigap between the minibands, and the applied electric field, all can be independently chosen. In contrast, in prior art pre-biased SLs all three parameters are strongly interdependent.

This independence of parameters in our invention also allows us to achieve essentially spatially symmetric wavefunctions in essentially all of the states in the miniband.

In this type of ISB SL emitter it is generally preferred that the I/R regions are doped (e.g., n-type with Si) whereas the RT regions are undoped so as to reduce electron scattering by dopant ions and hence broadening of the emission spectrum.

Figure 6:
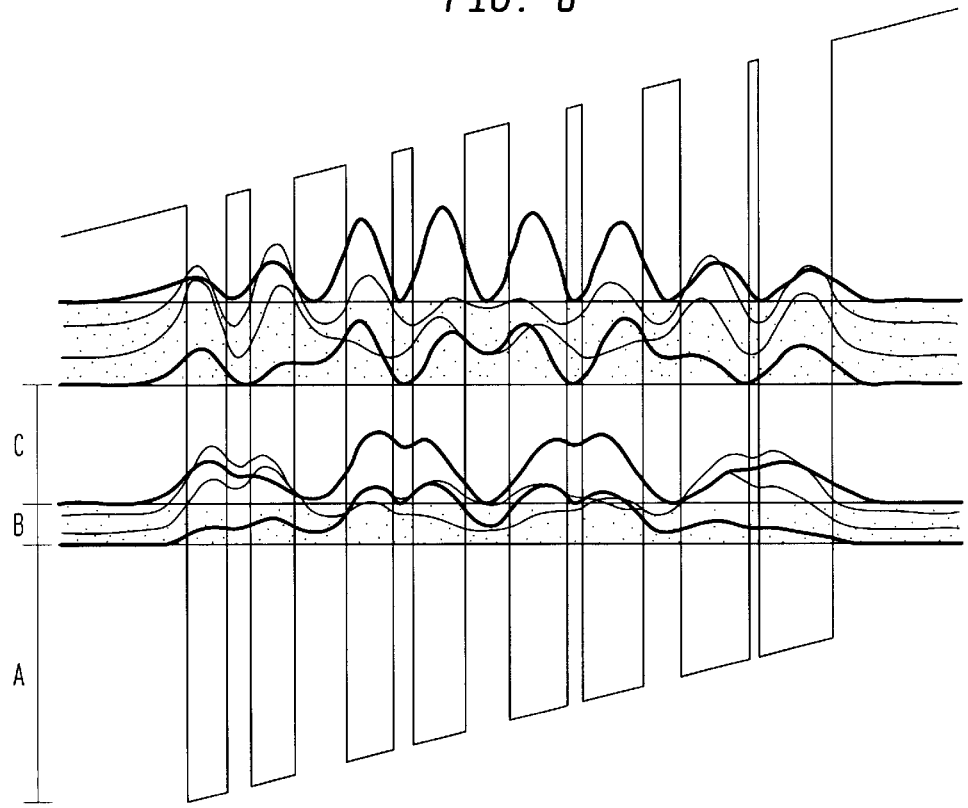
FIG. 6 is a schematic, conduction band profile of an SPQW RT region in accordance with one embodiment of our invention. This figure shows a typical flatband condition of the minibands with essentially symmetric wavefunctions (moduli squared) in the presence of an applied electric field. The energy of the confined ground state (A), the miniband width (B), the minigap (C) and the electric field strength can be selected by design independent of one another.
Figure 7:
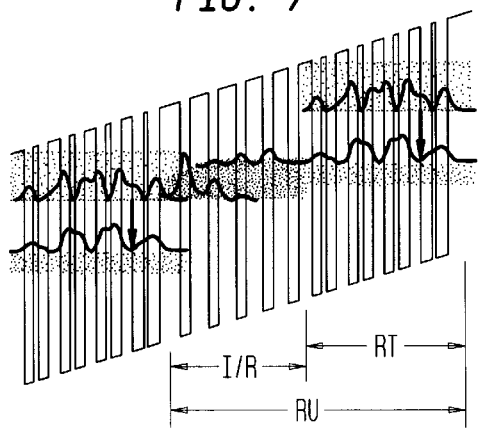
FIG. 7 is a schematic, conduction band profile of a pair of SPQW RT regions coupled by an injection/relaxation (I/R) region in accordance with the embodiment of FIG. 6. This figure also shows a typical flatband condition of the minibands with essentially symmetric wavefunctions (moduli squared) in the presence of an applied electric field. The lightly stippled areas represent the energy range spanned by the states making up the minibands in the RT regions, whereas the heavily stippled area represents the energy range spanned by the injector states. The straight arrows correspond to the laser transitions.

The conduction band structure and the moduli squared of the wavefunctions of a RT region of such an ISB laser are shown in FIG. 6 in accordance with one embodiment of our invention. This RT region comprises a pre-biased SL with four SPQWs. Note the flatbands and the symmetry of the wavefunctions. A repeat unit (RU), including an RT region (having a multiplicity of SPQWs and a pre-biased SL) and an I/R region, is shown in FIG. 7. In Example I, which follows, we describe experimental results obtained from such an ISB laser.

EXAMPLE I

SPQW Pre-biased SL with I/R Regions

This example describes a Group III–V compound semiconductor, QC laser in which I/R regions separate adjacent RT regions and each RU includes a pre-biased SL and a multiplicity of SPQWs, in accordance with one embodiment of our invention. Various materials, dimensions and operating conditions are provided by way of illustration only and, unless otherwise expressly stated, are not intended to limit the scope of the invention. As used herein, the term undoped means that a particular semiconductor layer or region is not intentionally doped; i.e., any doping of such a region or layer is relatively low and typically results from residual or background doping in the chamber used to grow the layers of the device.

The general design of the laser was similar to that shown in FIG. 1 except that we used a deep-etched ridge waveguide structure. A schematic diagram of two RT regions with an intermediate I/R region of the QC-SL laser is shown in FIG. 7 for wafer D2636. The laser was designed for emission at a center wavelength of about 10.8 $\mu$m. The exact layer sequence is given in Tables I–III. Fifty-five RUs were grown using InGaAs quantum well layers and AlInAs barrier layers lattice-matched to an n-type doped InP substrate using molecular beam epitaxy (MBE). The resulting stack was embedded in a dielectric QC-laser waveguide identical to that described by A. Tredicucci et al. in *Electronic Lett.*, Vol. 36, No. 10, pp. 876–877 (May 2000) and incorporated herein by reference. The lasers were processed as deep etched ridge waveguide lasers with stripe widths ranging from 11 to 17 $\mu$m, measured at midpoint of the ridge, and were cleaved into bars with a length of 2.25 mm. The facets were left uncoated. The lasers were soldered to a copper heat sink, wire bonded, and then mounted on the cold finger of a variable temperature cryostat.

In this laser design each RT had 8 states, all of which were essentially spatially symmetric.

Figure 8:
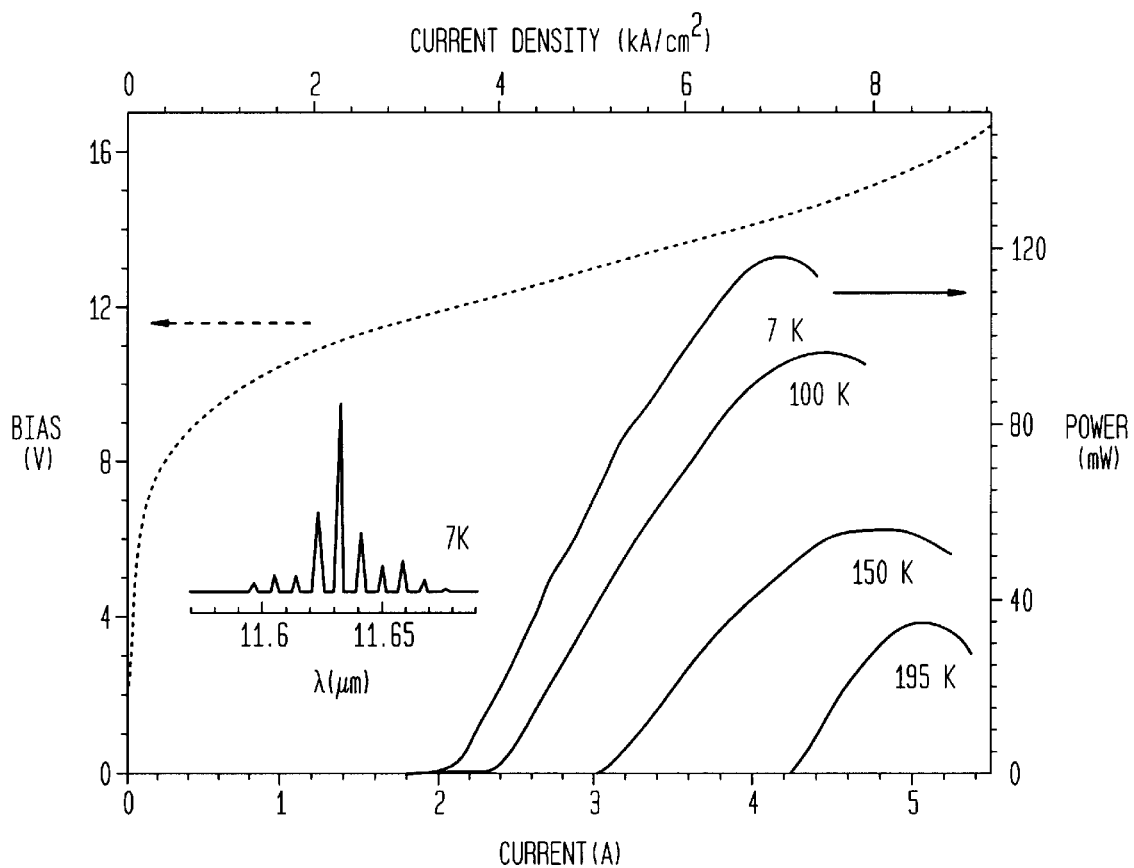
FIG. 8 shows the pulsed optical power of an ISB SL laser of the type depicted in FIG. 7 as a function of drive current for various heat sink temperatures. The power was extracted from a single facet (with near unity collection efficiency) of a deep-etched, stripe geometry laser in which the stripe had a length of 2.25 mm and width of 17 $\mu$m. The dotted line shows the I–V characteristic at 7 K. The inset shows the observed Fabry-Perot spectrum above threshold at 7 K.

The pulsed L-I characteristics of a laser having a 17 $\mu$m wide stripe are shown in FIG. 8 for various temperatures of operation ranging from approximately 7 K to 195 K. Current pulses of about 50 ns duration and 5 kHz repetition rate were used for this measurement. The light output (emission) from the laser was collected using a fast, calibrated room temperature HgCdTe (MCT) photovoltaic detector and a boxcar technique. The peak power was 120 mW at 7 K and 12.5 mW at 195 K.

The measured threshold current density $J_{th}$ of the laser was 3.5 kA/cm$^2$ at 7 K heat sink temperature, increasing to 7.5 kA/cm$^2$ at 195 K, the highest operating temperature. The low temperature measurement compared well with an estimated value of 1.7 kA/cm$^2$. The factor of two higher in the measured value may be attributable to loss from the SiN/metal sidewalls of the ridge and/or to lower injection efficiency, which were not accounted for in the calculation. The laser transition occured between the lowest (level 2) and the topmost (level 1) states of the second and first minibands respectively. We calculated an electron scattering time due to longitudinal optical phonons of $\tau_{21}=3.2$ ps between these two states, which was much longer than the calculated total lifetime of the lower laser level, $\tau_1=0.3$ ps, ensuring population inversion. The total scattering lifetime of the upper laser level was $\tau_2=0.7$ ps. The optical dipole matrix element was calculated as $z_{21}=2.7$ nm, and the width of the electroluminescence spectrum was 20 meV, as measured from a device having a circular mesa geometry to avoid gain narrowing effects. The voltage applied to the device at threshold, 12V, was close to the design voltage of 10.4 volts across the stack of RT and I/R regions. Part of the discrepancy is accounted for by additional voltage drop in the cladding and contact layers.

The inset of FIG. 8 shows the characteristic mode spectrum of a Fabry-Perot design of one of our lasers operated in a pulsed mode and at a center wavelength around 11.6 μm. The spectral measurements were performed using a Nicolet Fourier Transform Infrared Spectrometer (FTIR) and a cooled MCT detector.

The design of the overall QC laser is given in Table I. Details of the digitally graded regions have not been provided inasmuch as they are not critical and in general are well known in the art. Tables II and III give additional details of the I/R and RT regions, respectively.

TABLE I

| QC Laser Structure | Composition | Doping Concentration (cm$^{-3}$) | Thickness (Å) |
|---|---|---|---|
| Cladding | GaInAs | n = 4 × 10$^{18}$ | 8000 |
| Cladding | Digitally Graded GaAlInAs | n = 3 × 10$^{17}$ | 294 |
| Cladding | AlInAs | n = 3 × 10$^{17}$ | 10000 |
| Cladding | AlInAs | n = 1 × 10$^{17}$ | 20000 |
|  | Digitally Graded GaAlInAs | n = 1 × 10$^{17}$ | 294 |
| Core | GaInAs | n = 5 × 10$^{16}$ | 4000 |
| Core | Digitally Graded GaAlInAs | n = 5 × 10$^{16}$ | 457 |
| Core (Repeat Unit; N = 55) | Pre-biased RT region w/SPQWs | undoped | 295 |
|  | I/R region | n = 1.4 × 10$^{17}$ | 278 |
|  | GaInAs | n = 5 × 10$^{16}$ | 6500 |
|  | Digitally Graded GaAlInAs | n = 1 × 10$^{17}$ | 250 |
| Substrate | InP | n = 1 – 4 × 10$^{17}$ | — |

Note that in this embodiment of our invention the I/R regions were doped n-type (with Si); the RT regions were not.

Note that in this embodiment of our invention the I/R regions were doped n-type (with Si); the RT regions were not.

The details of each of the conventional GaInAs/AlInAs I/R regions are shown in Table II.

TABLE II

| I/R Region Composition | Doping Concentration (cm$^{-3}$) | Thickness (Å) |
|---|---|---|
| GaInAs | undoped | 21 |
| AlInAs | undoped | 31 |
| GaInAs | undoped | 20.3 |
| AlInAs | undoped | 33 |
| GaInAs | n = 1.4 × 10$^{17}$ | 19.9 |
| AlInAs | n = 1.4 × 10$^{17}$ | 35 |
| GaInAs | n = 1.4 × 10$^{17}$ | 19.3 |
| AlInAs | undoped | 38 |
| GaInAs | undoped | 18.8 |
| AlInAs | undoped | 42 |

Table III shows the varying layer thicknesses of the undoped layers that make up the RT regions (pre-biased SLs and four SPQWs) for sample D2636, in accordance with one embodiment of our invention. The applied electric field (not shown) would be oriented in the upward direction; i.e., from the bottom to the top of table.

TABLE III

| Quantum Wells/Barriers | RT Region Composition | Thickness (Å) |
|---|---|---|
| SPQW1-subwell | GaInAs | 24.5 |
| SPQW1-barrier | AlInAs | 7.3 |
| SPQW1-subwell | GaInAs | 23.1 |
| Standard Barrier | AlInAs | 20 |
| SPQW2-subwell | GaInAs | 22.2 |
| SPQW2-barrier | AlInAs | 8.6 |
| SPQW2-subwell | GaInAs | 20.8 |
| Standard Barrier | AlInAs | 21 |
| SPQW3-subwell | GaInAs | 19.9 |
| SPQW3-barrier | AlInAs | 9.7 |
| SPQW3-subwell | GaInAs | 19 |
| Standard Barrier | AlInAs | 24.3 |
| SPQW4-subwell | GaInAs | 18 |
| SPQW4-barrier | AlInAs | 10.6 |
| SPQW4-subwell | GaInAs | 17.1 |
| Standard Barrier | AlInAs | 28.6 |

This table shows that overall QW thicknesses (including the thin barriers) range from about 46–55 Å, the sub-well thicknesses range from about 17–24 Å, the thicknesses of the thinner barriers that split the QWs range from about 7–11 Å, and the thicknesses of the standard barriers range from about 20–29 Å.

Injectorless ISB SL Light Emitters

In the foregoing discussion we have demonstrated ISB SL lasers in which the RT regions comprise the combination of pre-biased SLs and a multiplicity of SPQWs. The features of this novel design allow for much greater flexibility than previous SL ISB lasers, opening the possibility for additional embodiments of our invention. One such design is an injectorless ISB SL laser; that is, an ISB laser that includes no I/R regions between RT SL regions (as defined above). The elimination of the I/R regions increases the overlap of the mode intensity profile with the RT regions while also increasing the number of RT regions that fit within a given waveguide core. (Even though there are no I/R regions to provide a line of demarcation between adjacent RT regions, the latter are nevertheless distinguishable from one another because the grading of their SLs restarts at the beginning of each RT region.) Computer modeling shows that this design should lower the threshold and increase the output power compared to an ISB SL laser that utilizes L/R regions.

Figure 9:
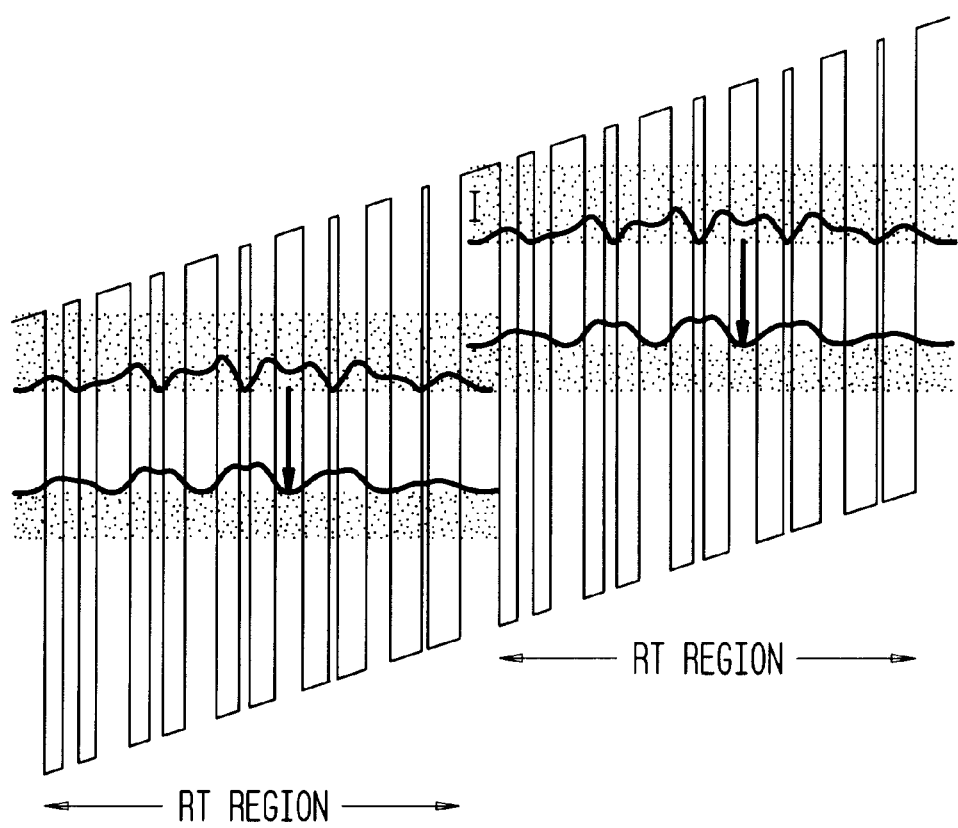
FIG. 9 is a schematic, conduction band profile of an injectorless ISB SL laser in accordance with another embodiment of our invention. This figure also shows a typical flatband condition of the minibands with essentially symmetric wavefunctions (moduli squared) in the presence of an applied electric field. The stippled areas represent the energy range spanned by the states making up the minibands in the RT regions. The straight arrows correspond to the laser transitions.

FIG. 9 shows a pair of adjacent RT regions of an ISB SL laser in accordance with this embodiment of our invention. Each RT region comprises the combination of a pre-biased SL and a multiplicity of SPQWs, as discussed above. The moduli-squared of the wavefunctions involved in the optical transitions (straight arrows) extend over the entire length of one period (i.e., over the length of each RT region). The stippled areas represent the energy range of the SL minibands. The design enables the relative energy levels (height in this graph) to be positioned so that current can flow from the lower miniband of one RT into the upper miniband of the next stage even though no I/R region is present. (In prior art ISB lasers, the lower miniband of one RT region does not align with the upper miniband of an adjacent RT region, hence the need for I/R regions in those designs.)

In addition, in this embodiment of our invention it is currently preferred that at least some of the RT regions are doped even though the presence of dopant ions might lead to broadening of the emission spectrum. Otherwise, downstream RT regions (relative to the direction of electron flow) might have to "wait" for upstream electrons to arrive before a radiative transition could take place. To alleviate this potential problem, we prefer to confine doping to RT regions at or near the downstream end of the core. However, other doping patterns, including doping of all of the RT regions, are not excluded.

EXAMPLE II

Injectorless ISB Emitter with SPQW Pre-biased SL

This example describes Group III–V compound semiconductor, injectorless QC SL lasers; i.e., QC lasers in which no I/R regions separate adjacent RT regions and each RT region includes a pre-biased SL and a multiplicity of SPQWs, in accordance with the immediately preceding embodiment of our invention. As before, various materials, dimensions and operating conditions are provided by way of illustration only and, unless otherwise expressly stated, are not intended to limit the scope of the invention; and the term undoped means that a particular semiconductor layer or region is not intentionally doped; i.e., any doping of such a region or layer is relatively low and typically results from residual or background doping in the chamber used to grow the layers of the device.

The general design of the lasers was similar to that shown in FIG. 1 except that we used a deep-etched ridge waveguide structure. A schematic diagram showing two representative RT regions out of a multiplicity in the QC SL laser is shown in FIG. 9. Each RT region included a pre-biased SL and four (wafer D2666) or five (wafer D2630) SPQWs. The lasers were designed for emission at a center wavelength of about 10.8 $\mu$m (wafers D2630 and D2666). The exact layer sequence is given in Tables IV–VI. In one case 50 RTs were grown (wafer D2630) and in another 80 RTs were grown (wafer D2666). In both cases the RTs included InGaAs quantum well layers and AlInAs barrier layers lattice-matched to an n-type InP substrate using molecular beam epitaxy (MBE). The resulting stack was embedded in a dielectric QC laser waveguide identical to that described by A. Tredicucci et al., supra. The lasers were processed as deep-etched ridge waveguide lasers with stripe widths ranging from 11 to 17 $\mu$m, measured at midpoint of the ridge, and were cleaved into bars with a length of 2.25 mm. The facets were left uncoated. The lasers were soldered to a copper heat sink, wire bonded, and then mounted on the cold finger of a variable temperature cryostat.

Lasers from wafer D2666 had 8 states in each RT region, 4 of which were essentially spatially symmetric, whereas those from wafer D2630 had 10 states, all of which were essentially spatially symmetric.

Figure 10:
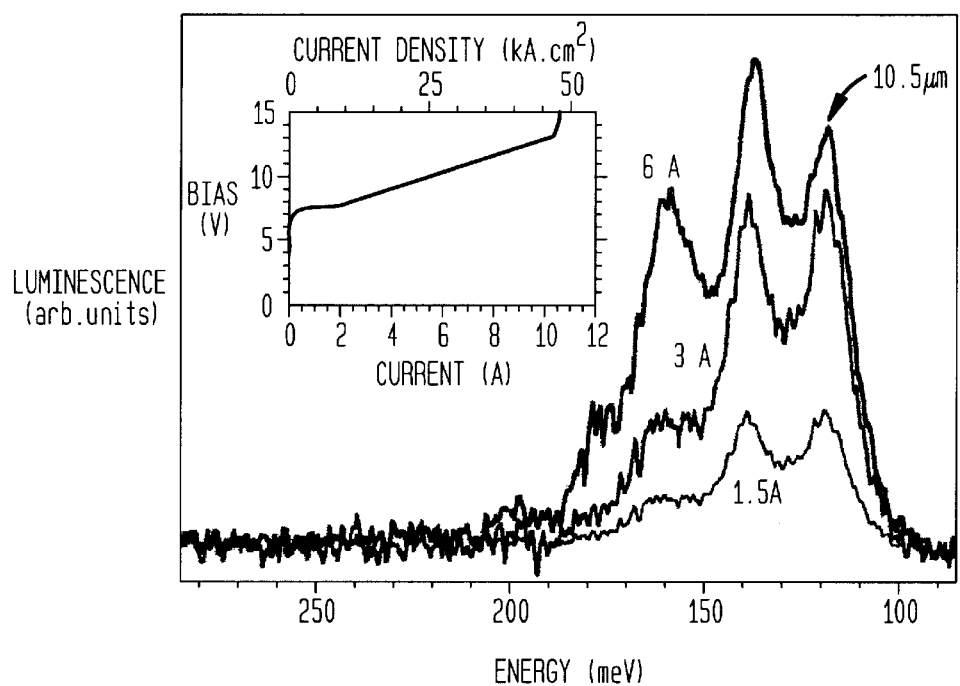
FIG. 10 shows the electroluminescence spectra of an ISB SL light emitter of the type shown in FIG. 9 at various drive currents. The arrow at 10.5 $\mu$m (about 125 meV) is provided for reference purposes only. The inset shows an I–V curve of the device.
Figure 11:
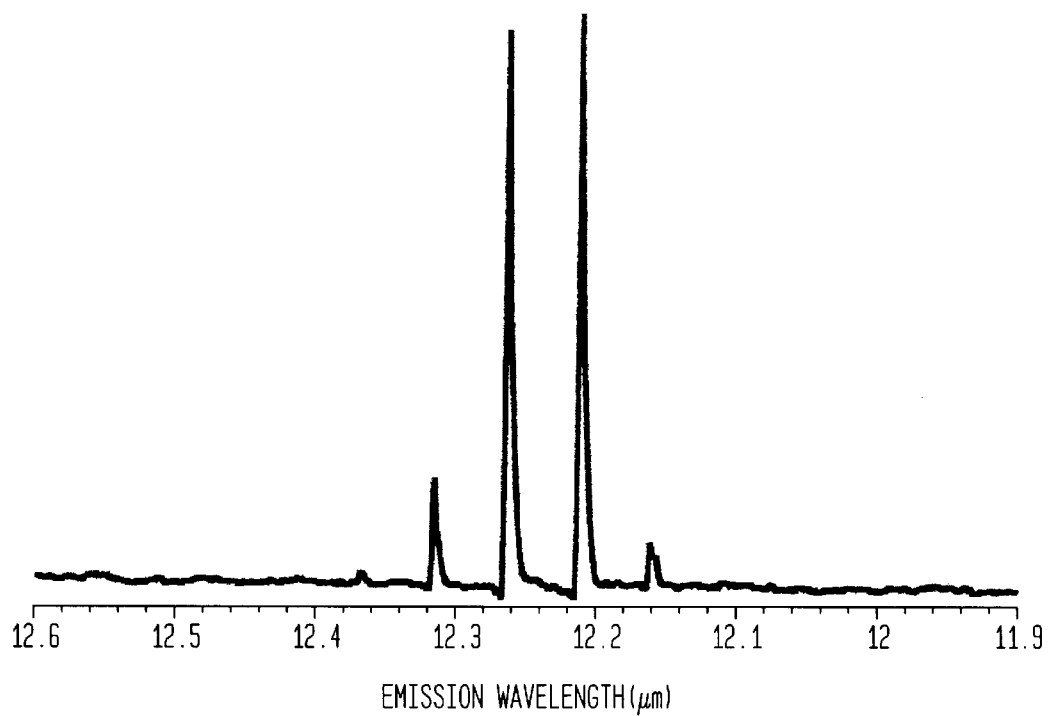
FIG. 11 is a Fabry-Perot spectrum of an ISB SL laser of the type shown in FIG. 9 operated in a pulsed mode at about 10 K.

FIG. 10 shows the electroluminescence of a ridge waveguide emitter from wafer D2630 at various drive currents ranging from 1.5 A to 6 A. The inset is an I–V characteristic of the same device. The high current densities indicate that the emitter is capable of carrying relatively high currents, which is required, for example, for high output power lasers. The electroluminescence shows that the emitted light is at the design frequency/wavelength, and other peaks in the characteristic indicate the presence of an SL with well-extended states. On the other hand, FIG. 11 shows the multimode Fabry-Perot spectrum of a laser from wafer D2666 with a center wavelength around 12.2–12.3 $\mu$m.

The design of the overall QC laser is given in Table IV. Details of the digitally graded regions have not been provided inasmuch as they are not critical and in general are well known in the art. Tables V and VI give additional details of the RT regions of lasers from wafers D2630 and D2666, respectively.

TABLE IV

| QC Laser Structure (D2630) | Composition | Doping Concentration (cm$^{-3}$) | Thickness (A) |
|---|---|---|---|
| Cladding | GaInAs | n = 4 × 10$^{18}$ | 8000 |
| Cladding | Digitally Graded GaAlInAs | n = 3 × 10$^{17}$ | 294 |
| Cladding | AlInAs | n = 3 × 10$^{17}$ | 10000 |
| Cladding | AlInAs | n = 1 × 10$^{17}$ | 20000 |
|  | Digitally Graded GaAlInAs | n = 1 × 10$^{17}$ | 294 |
| Core | GaInAs | n = 5 × 10$^{16}$ | 4000 |
| Core | Digitally Graded GaAlInAs | n = 6 × 10$^{16}$ | 280 |
| Core (Repeat Unit; N = 50) | No I/R Region Pre-biased RT region w/SPQWs | — n = 6 × 10$^{16}$ | — 396 |
| Core | GaInAs | n = 5 × 10$^{16}$ | 6500 |
|  | Digitally Graded GaAlInAs | n = 1 × 10$^{17}$ | 250 |
| Substrate | InP | n = 1 – 4 × 10$^{17}$ | — |

The design of wafer D2666 was nearly identical to that shown in Table IV except that the digitally graded region immediately above and adjacent the RT regions was lower doped to n=5×10$^{16}$ and was only 173 A thick. Also, there were 80 RT regions in wafer D2666, each having a total thickness of 274 A, and each RT region had four SPQWs rather than five. Tables V and VI show the varying layer thicknesses of the layers that make up the RT regions (pre-biased SLs and five SPQWs for sample D2630; pre-biased SLs and four SPQWs for sample D2666), in accordance with one embodiment of our invention. The applied electric field (not shown) would be oriented in the upward direction; i.e., from the bottom to the top of the table.

TABLE V

| Quantum Wells/ Barriers (D2630) | RT Region Composition | Doping Concentration (cm$^{-3}$) | Thickness (A) |
|---|---|---|---|
| SPQW1-subwell | GaInAs | undoped | 29 |
| SPQW1-barrier | AlInAs | undoped | 5.86 |
| SPQW1-subwell | GaInAs | undoped | 26.5 |
| Standard Barrier | AlInAs | undoped | 22 |
| SPQW2-subwell | GaInAs | n = 6 × 10$^{16}$ | 25 |
| SPQW2-barrier | AlInAs | n = 6 × 10$^{16}$ | 7.8 |
| SPQW2-subwell | GaInAs | n = 6 × 10$^{16}$ | 23.2 |
| Standard Barrier | AlInAs | undoped | 24.7 |
| SPQW3-subwell | GaInAs | n = 6 × 10#6 | 21.7 |

TABLE V-continued

| Quantum Wells/ Barriers (D2630) | RT Region Composition | Doping Concentration (cm$^{-3}$) | Thickness (A) |
|---|---|---|---|
| SPQW3-barrier | AlInAs | n = 6 × 10$^{16}$ | 9.51 |
| SPQW3-subwell | GaInAs | n = 6 × 10$^{16}$ | 20.25 |
| Standard Barrier | AlInAs | undoped | 27.2 |
| SPQW4-subwell | GaInAs | n = 6 × 10$^{16}$ | 18.9 |
| SPQW4-barrier | AlInAs | n = 6 × 10$^{16}$ | 11 |
| SPQW4-subwell | GaInAs | n = 6 × 10$^{16}$ | 17.6 |
| Standard Barrier | AlInAs | undoped | 29.7 |
| SPQW5-subwell | GaInAs | undoped | 16.4 |
| SPQW5-barrier | AlInAs | undoped | 12.2 |
| SPQW5-subwell | GaInAs | undoped | 15.2 |
| Standard Barrier | AlInAs | undoped | 32 |

Note that the three central SPQW regions of D2630 (and their associated thin barrier layers) were doped n-type (with Si), whereas the two endmost SPQW regions were not.

Table V shows that overall QW thicknesses range from about 43–61 A, the sub-well thicknesses range from about 15–29 A, the thicknesses of the thinner SPQW barriers range from about 23–32 A, and the thicknesses of the standard barriers range from about 17–24 A.

TABLE VI

| Quantum Wells/ Barriers (D2666) | RT Region Composition | Doping Concentration (cm$^{-3}$) | Thickness (A) |
|---|---|---|---|
| SPQW1-subwell | GaInAs | undoped | 28.7 |
| SPQW1-barrier | AlInAs | undoped | 4 |
| SPQW1-subwell | GaInAs | undoped | 25.2 |
| Standard Barrier | AlInAs | undoped | 11.5 |
| SPQW2-subwell | GaInAs | undoped | 23.8 |
| SPQW2-barrier | AlInAs | undoped | 6.1 |
| SPQW2-subwell | GaInAs | undoped | 21.3 |
| Standard Barrier | AlInAs | undoped | 14.8 |
| SPQW3-subwell | GaInAs | undoped | 19.8 |
| SPQW3-barrier | AlInAs | undoped | 7.8 |
| SPQW3-subwell | GaInAs | n = 4 × 10$^{17}$ | 18 |
| Standard Barrier | AlInAs | undoped | 16.9 |
| SPQW4-subwell | GaInAs | n = 4 × 10$^{17}$ | 16.2 |
| SPQW4-barrier | AlInAs | n = 4 × 10$^{17}$ | 5.7 |
| SPQW4-subwell | GaInAs | n = 4 × 10$^{17}$ | 15.2 |
| Standard Barrier | AlInAs | undoped | 39 |

Note that the fourth SPQW region and its associated thin barrier layers, as well as one sub-well of SPQW3, were doped n-type (with Si), whereas the remaining SPQW regions and barriers were not.

Table VI shows that overall QW thicknesses range from about 37–58 A, the sub-well thicknesses range from about 15–29 A, the thicknesses of the thinner SPQW barriers range from about 4–8 A, and the thicknesses of the standard barriers range from about 12–39 A.

The combination of Tables II, V and VI indicates that suitable ranges for these thicknesses are as follows: overall QW thicknesses range from about 37–61 A, the sub-well thicknesses range from about 15–29 A, the thicknesses of the thinner SPQW barriers range from about 4–12 A, and the thicknesses of the standard barriers range from about 12–39 A. The layer thicknesses chosen for a particular design depends on various parameters, such as: the desired frequency/wavelength of the emission, miniband widths, electric field strength, and number of SPQWs.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention.

What is claimed is:

1. An intersubband (ISB) superlattice (SL) light emitter comprising:
    a core region including a multiplicity of repeat units, each repeat unit including a unipolar radiative transition (RT) SL region, each of said RT SL regions comprising a plurality of quantum well (QW) regions interleaved with a plurality of first barrier regions, said QW regions having energy states characterized by upper and lower minibands, and
    electrodes for applying an electric field to said emitter effective to cause said RT regions to generate light at an energy determined by upper and lower energy states within said minibands,
    in at least a first subset of said QW regions, the internal electronic potential being pre-biased so that, despite the presence of said applied field in said SLs, an essentially flatband condition of both said upper and lower minibands exists, characterized in that
        each of said QW regions includes at least one second barrier region that splits said QW region into a multiplicity of coupled sub-wells, the thicknesses of said second barrier regions being such that the wavefunctions of at least said upper and lower states are essentially spatially symmetric with respect to the midplane of each RT region and said minibands can be independently positioned within said QW regions.

2. The invention of claim 1 wherein the thicknesses of said second barrier regions are such that essentially all of said wavefunctions are essentially spatially symmetric with respect to said midplane.

3. The invention of claim 1 wherein said second barrier regions are sufficiently thin that said states (1) are split beyond their natural broadening and (2) contribute to different minibands in each RT region.

4. The invention of claim 3 wherein said second barrier regions have thicknesses in the approximate range of 4–12 A.

5. The invention of claim 4 wherein said first barrier regions have thicknesses in the approximate range of 12–39 A, said QW regions have overall thicknesses in the approximate range of 37–61 A, and said sub-wells have thicknesses in the approximate range of 15–29 A.

6. The invention of claim 1 wherein each of said repeat units includes no injection/relaxation (I/R) region.

7. The invention of claim 6 wherein only some of said RT regions are doped.

8. The invention of claim 7 wherein said doped RT regions are located downstream relative to the direction of electron flow in said core region.

9. The invention of claim 1 wherein each repeat unit further includes an injection/relaxation (I/R) region adjacent to its RT region.

10. The invention of claim 9 wherein said I/R regions are doped and said RT regions are undoped.

11. The invention of claim 1 wherein said core region comprises layers of In-based Group III–V compound semiconductor layers.

12. The invention of claim 11 wherein said core region comprises layers of GaInAs and layers of AlInAs.

13. A quantum cascade (QC) superlattice (SL) laser comprising:
    a core region including a multiplicity of repeat units, each repeat unit including a unipolar radiative transition (RT) SL region, each of said RT SL regions comprising a plurality of quantum well (QW) regions interleaved with a plurality of first barrier regions, said QW regions having energy states characterized by upper and lower minibands, a pair of cladding regions bounding said core region, and electrodes for applying an electric field to said laser effective to cause said RT regions to generate laser action at an energy determined by upper and lower energy states of said QW regions, said upper and lower levels being located within said upper and lower minibands, respectively, and in the presence of said field the upper miniband of one RT region being aligned with the lower miniband of an adjacent RT region, in at least a first subset of said QW regions within each of said RT regions the thicknesses of said QW regions increasing from QW region to QW region in the direction of said applied field, and in at least a second subset of said first barrier regions within each of said RT regions the thicknesses of said first barrier regions varying from barrier region to barrier region in the direction of said applied field, so that, in the absence of said applied field, said upper and lower energy states are located each at different energies from region to region within said first subset, and so that, in the presence of said applied field, an essentially flatband condition of both said upper and lower minibands exists across adjacent RT regions, characterized in that each of said QW regions includes at least one second barrier region that splits said QW region into a multiplicity of coupled sub-wells, the thicknesses of said second barrier layers being such that the wavefunctions of at least said upper and lower states are essentially spatially symmetric with respect to the midplane of each RT region and said minibands can be independently positioned within said QW regions, and said second barrier regions are sufficiently thin that said states (1) are split beyond their natural broadening and (2) contribute to different minibands in each RT region.

14. The invention of claim 13 wherein the thicknesses of said second barrier regions are such that essentially all of said wavefunctions are essentially spatially symmetric with respect to said midplane.

15. The invention of claim 13 wherein said second barrier regions have thicknesses in the approximate range of 4–12 A.

16. The invention of claim 15 wherein said first barrier regions have thicknesses in the approximate range of 12–39 A, said QW regions have overall thicknesses in the approximate range of 37–61 A, and said sub-wells have thicknesses in the approximate range of 15–29 A.

* * * * *